(12) United States Patent
Furukawa et al.

(10) Patent No.: US 7,652,334 B2
(45) Date of Patent: *Jan. 26, 2010

(54) SHALLOW TRENCH ISOLATION FORMATION

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/866,471

(22) Filed: Oct. 3, 2007

(65) Prior Publication Data
US 2008/0017932 A1    Jan. 24, 2008

Related U.S. Application Data

(60) Continuation of application No. 11/445,786, filed on Jun. 2, 2006, now Pat. No. 7,348,634, which is a division of application No. 10/905,681, filed on Jan. 17, 2005, now Pat. No. 7,087,531.

(51) Int. Cl.
*H01L 29/72* (2006.01)
(52) U.S. Cl. .................. 257/368; 257/374; 257/401; 257/506; 257/622; 438/704

(58) Field of Classification Search ............... 257/368, 257/374, 401, 506, 622; 438/704
See application file for complete search history.

(56) References Cited

U.S. PATENT DOCUMENTS

| | | | |
|---|---|---|---|
| 5,923,992 | A | 7/1999 | Spikes et al. |
| 6,146,970 | A | 11/2000 | Witek et al. |
| 6,225,225 | B1 | 5/2001 | Goh et al. |
| 6,323,106 | B1 | 11/2001 | Huang et al. |
| 7,087,531 | B1 * | 8/2006 | Furukawa et al. ........... 438/704 |
| 2002/0137306 | A1 | 9/2002 | Chen |
| 2003/0015736 | A1 | 1/2003 | Beyer et al. |
| 2003/0040171 | A1 | 2/2003 | Weimer |
| 2003/0129540 | A1 | 7/2003 | Sheu et al. |
| 2003/0199151 | A1 | 10/2003 | Ho et al. |
| 2004/0029328 | A1 | 2/2004 | Lahaug |
| 2004/0038493 | A1 | 2/2004 | Shih et al. |

* cited by examiner

*Primary Examiner*—Edward Wojciechowicz
(74) *Attorney, Agent, or Firm*—Schmeiser, Olsen & Watts; W. Riyon Harding

(57) ABSTRACT

A method and structure for forming a semiconductor structure. A semiconductor substrate is provided. A trench is formed within the semiconductor substrate. A first layer of electrically insulative material is formed within the trench. A first portion and a second portion of the first layer of electrically insulative material is removed. A second layer of electrically insulative material is selectively grown on the first layer comprising the removed first portion and the removed second portion.

20 Claims, 18 Drawing Sheets

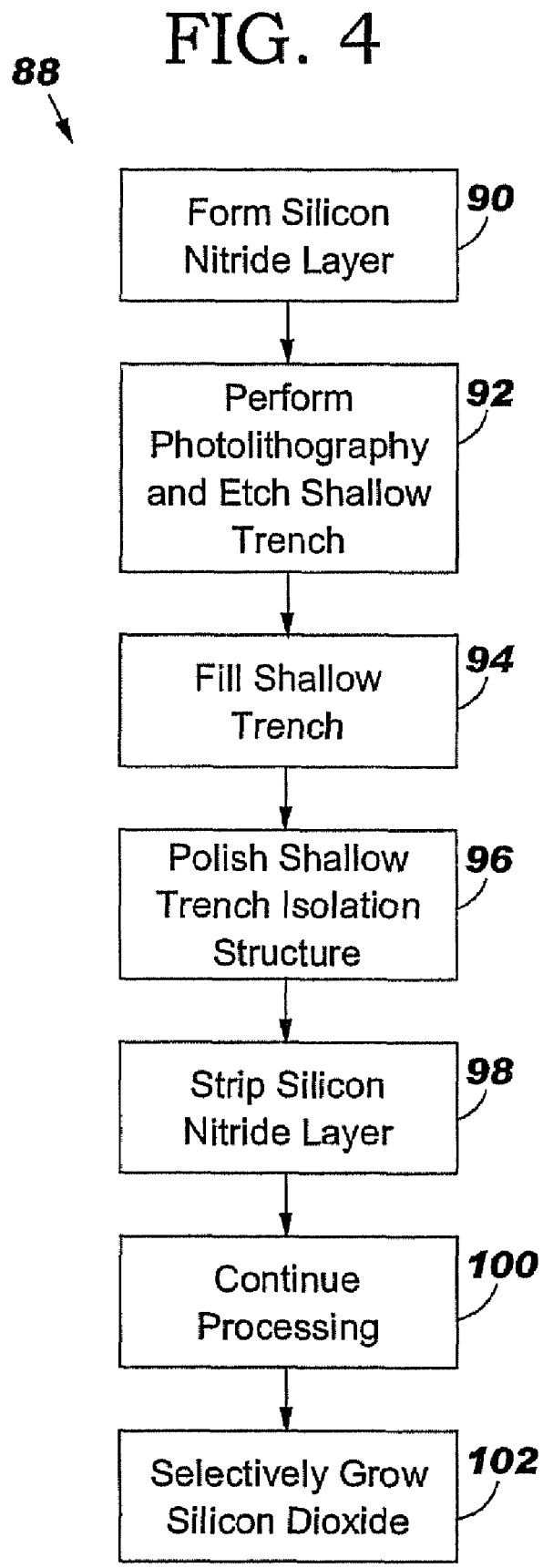

though shallow trench isolation fill 10 comprises silicon dioxide. The process is described herein as related to FIGS. 1F-1H.

SHALLOW TRENCH ISOLATION FORMATION

This application is a continuation application claiming priority to Ser. No. 11/445,786, filed Jun. 2, 2006, which is a Divisional of U.S. Pat. No. 7,087,531, issued Aug. 8, 2006.

BACKGROUND OF THE INVENTION

1. Technical Field

The present invention relates to a structure and associated method for fabricating a shallow trench isolation in a semiconductor device.

2. Related Art

During a manufacturing process, electrical structures within electrical devices undergo structural changes. The structural changes may cause the electrical device to be built incorrectly. Therefore there exists a need to correct structural changes of electrical structures within electrical devices during a manufacturing process.

SUMMARY OF THE INVENTION

The present invention provides a semiconductor structure, comprising:

a semiconductor substrate, wherein said semiconductor substrate comprises a trench formed within a first portion of a first surface of said semiconductor substrate;

a first layer of electrically insulative material located within the trench, wherein said first layer comprises a first recess and a second recess, and wherein the first recess is isolated from the second recess by a portion of the first layer; and a second layer of electrically insulative material located on said first layer and within a first portion of said first recess and a second portion of said second recess.

The present invention provides a semiconductor structure, comprising:

a semiconductor substrate, wherein said semiconductor substrate comprises a trench formed within a first portion of a first surface of said semiconductor substrate;

a first layer of electrically insulative material form within the trench, wherein the first layer comprises a recess;

a second layer of electrically insulative material within the recess; and a third layer of electrically insulative material over said second layer, wherein said third layer comprises a first portion extending laterally over and parallel to a second portion of said first surface of said semiconductor substrate and a second portion extending laterally over and parallel to a third portion of said first surface of said semiconductor substrate, wherein said first portion of said third layer comprises a first convex surface, and wherein said second portion of said third layer comprises a second convex surface.

The present invention advantageously provides a structure and associated method to correct structural changes of electrical structures within electrical devices during a manufacturing process.

BRIEF DESCRIPTION OF THE DRAWINGS

FIG. 4 is a flowchart illustrating a semiconductor device fabrication method of FIGS. 1A-1H, in accordance with embodiments of the present invention.

DETAILED DESCRIPTION OF THE INVENTION

FIGS. 1A-1H, 2A-2H, 3A-3B, 4, 5, and 6 illustrate and describe a shallow trench isolation (STI) forming method and structure formed by layers of silicon dioxide. Note that any insulating material known to a person of ordinary skill in the art may be used instead of or in combination with silicon dioxide to form the shallow trench isolation.

Figure 1A:
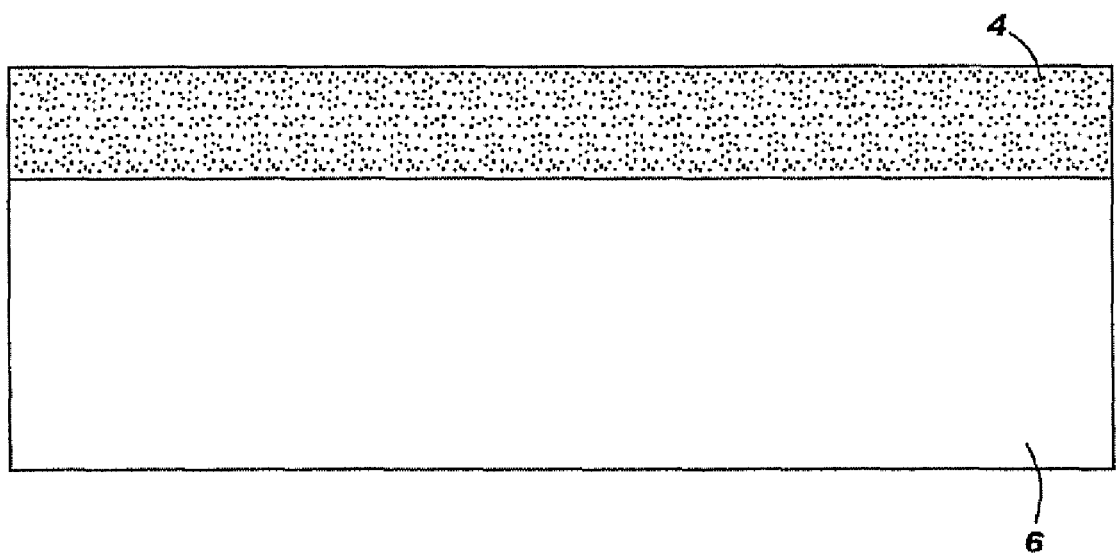
FIGS. 1A-1H illustrate stages in a fabrication of a shallow trench isolation in a semiconductor device, in accordance with embodiments of the present invention.
Figure 1B:
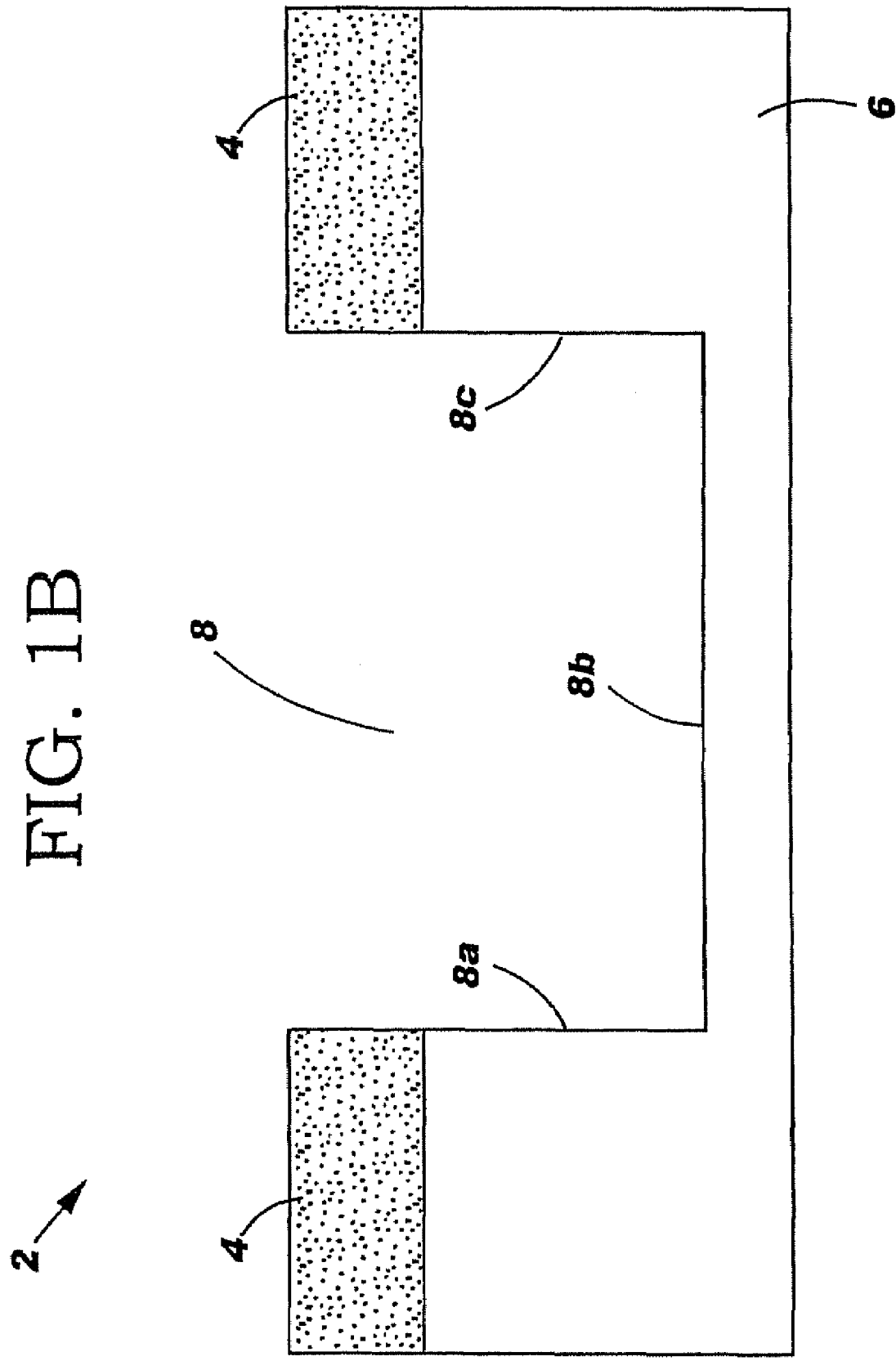
Figure 1C:
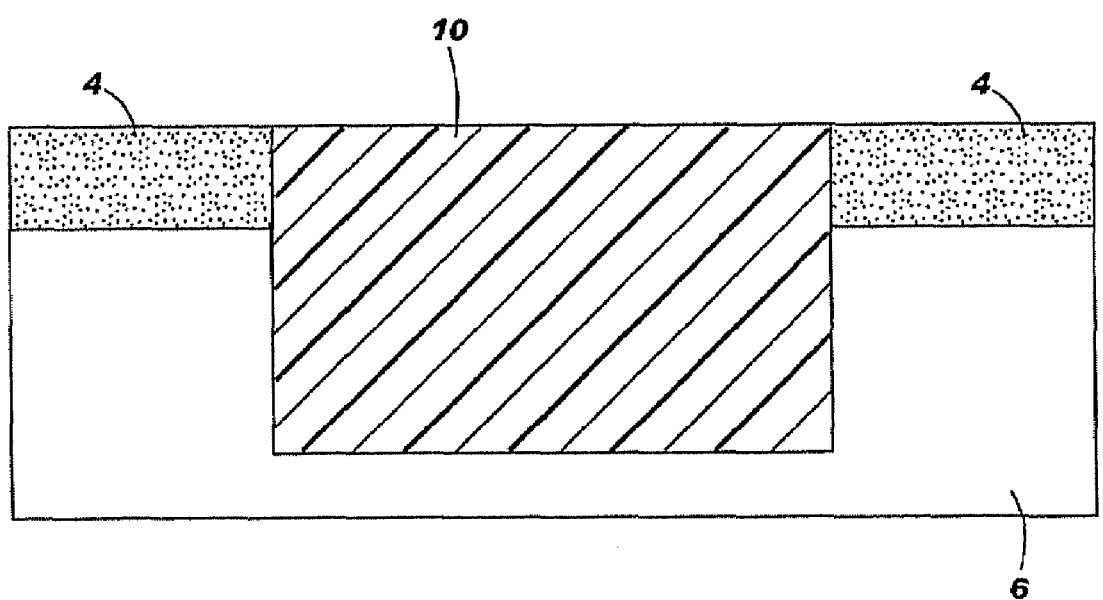
Figure 1D:
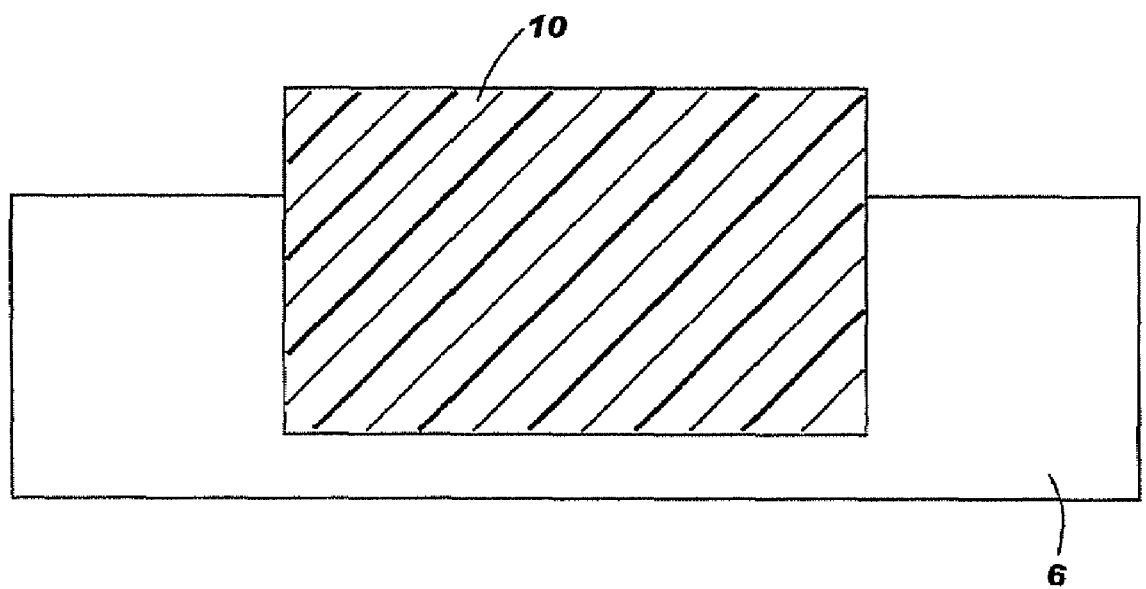
Figure 1E:
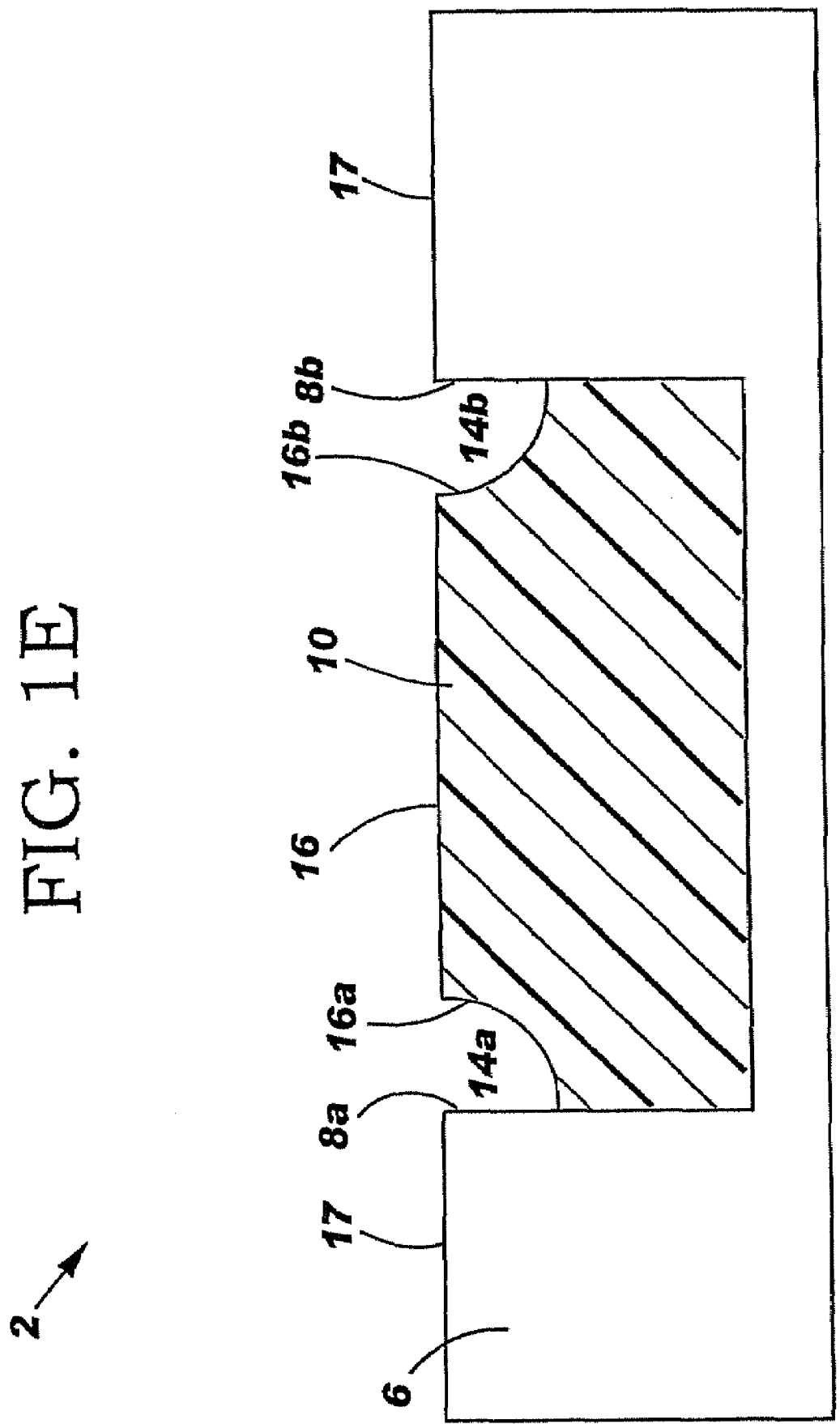
Figure 1F:
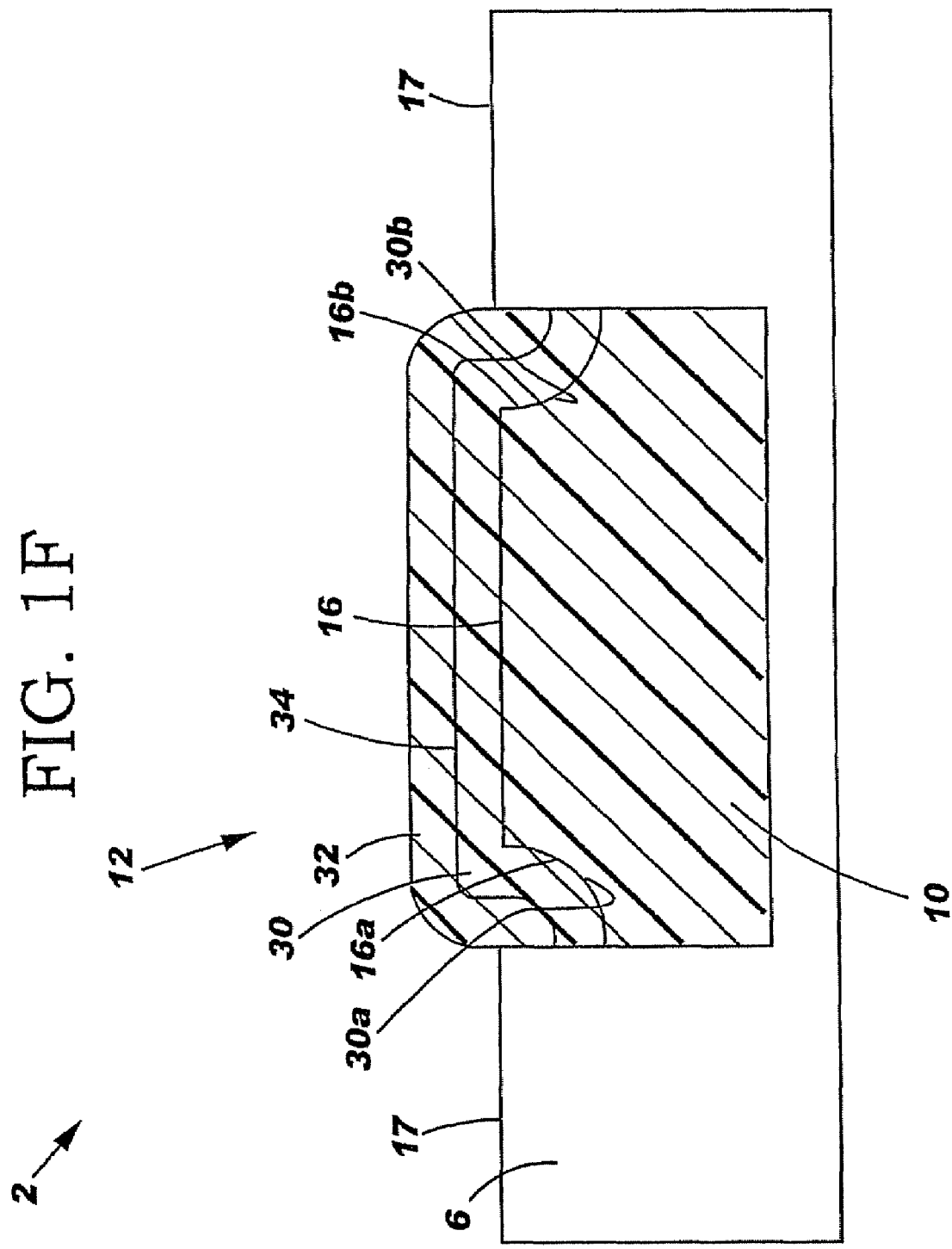

FIGS. 1A-1H illustrate stages in a fabrication of a shallow trench isolation 12 in a semiconductor device 2, in accordance with embodiments of the present invention. The semiconductor device 2 illustrated in FIGS. 1A-1H is a cross sectional view. The fabrication is described in greater detail with reference to FIG. 4. The fabrication begins in FIG. 1A with a formation of a silicon nitride layer 4 on a silicon substrate 6. The silicon substrate 6 may be any silicon substrate known to a person of ordinary skill in the art including, inter alia, bulk silicon substrate, silicon on insulator (SOI) substrate, etc. FIG. 1B illustrates the semiconductor device 2 with a shallow trench 8 formed. The shallow trench 8 comprises side surfaces 8a and 8b and a bottom surface 8c. The shallow trench 8 may be formed by any method known to a person of ordinary skill in the art including, inter alia, a reactive ion etching (RIE) process, etc. FIG. 1C illustrates the semiconductor device 2 comprising a shallow trench isolation fill 10 formed within the shallow trench 8. The shallow trench isolation fill 10 may comprise, inter alia, silicon dioxide, nitride, etc. The shallow trench isolation fill 10 may be formed by any method known to a person of ordinary skill in the art including, inter alia, a tetra ethyl ortho silicate (TEOS) chemical vapor deposition (CVD) process followed by a chemical/mechanical polishing (CMP) process, etc. FIG. 1D illustrates the semiconductor device 2 after the silicon nitride layer 4 has been removed from the silicon substrate 6. The silicon nitride layer 4 may be removed by any method known to a person of ordinary skill in the art including, inter alia, the use of hot phosphoric acid, etc. FIG. 1E illustrates the semiconductor device 2 with a surface 16 of the shallow trench isolation fill 10 about coplanar with a surface 17 of the silicon substrate 6. Additionally, the shallow trench isolation fill 10 comprises divots 14a and 14b (i.e., unwanted recesses). The divot 14a is located between side surface 8a of the trench 8 and a surface 16a of the shallow trench isolation fill 10. The divot 14b is located between a side surface 8a of the trench 8 and a surface 16b of the shallow trench isolation fill 10. The surface 16a comprises a concave surface. The surface 16b comprises a concave surface. The divots 14a and 14b may be caused during chemical processes (e.g., a hydrofluoric acid dip) used at several points in the fabrication of the shallow trench isolation fill 10 in order to clean the surface 17 of the silicon substrate 6 prior to a gate dielectric formation. The divots 14a and 14b may be repaired (i.e., filled) by selectively growing layers of silicon dioxide over the shallow trench isolation fill 10 and within the divots 14a and 14b as described with reference to FIG. 1F. An additional layer of silicon dioxide may extend laterally over and parallel to a portion of the surface 17 of the silicon substrate 6 as described with reference to FIG. 1G. Additionally, if desired, a layer of silicon oxynitride may be formed over the additional layer of silicon dioxide extending laterally over and parallel to a portion of the surface 17 of the silicon substrate 6 as described with reference to FIG. 1H. The term "selectively growing" silicon dioxide or any insulating material is defined herein as a process to grow the silicon dioxide (or any insulating material) only in a specified area (e.g., to fill a divot) and over a layer of silicon dioxide (or any insulating material). Selectively growing the silicon dioxide or any other electrically insulative material comprised by the trench 8 may comprise using a liquid phase deposition process as described in U.S. Pat. No. 6,653,245 (issued Nov. 25, 2003) hereby incorporated by reference in it's entirety. FIG. 1F illustrates the semiconductor structure 2 with a shallow trench isolation 12 comprising the shallow trench isolation fill 10, the shallow trench 8 (see FIG. 1B), selectively grown silicon dioxide layers 30 and 32 to fill the divots 14a and 14b (see FIG. 1E) in the shallow trench isolation fill 10. The silicon dioxide layer 30 has been selectively grown over the surface 16, 16a, and 16b and within a portion of the divots 14a and 14b. The silicon dioxide layer 30 comprises a convex surface 30a in contact with the concave surface 16a of the shallow trench isolation fill 10 and a convex surface 30b in contact with the concave surface 16b of the shallow trench isolation fill 10. The silicon dioxide layer 32 has been selectively grown over the surface 34 of the silicon dioxide layer 30 and within a portion of the divots 14a and 14b.

Figure 1G:
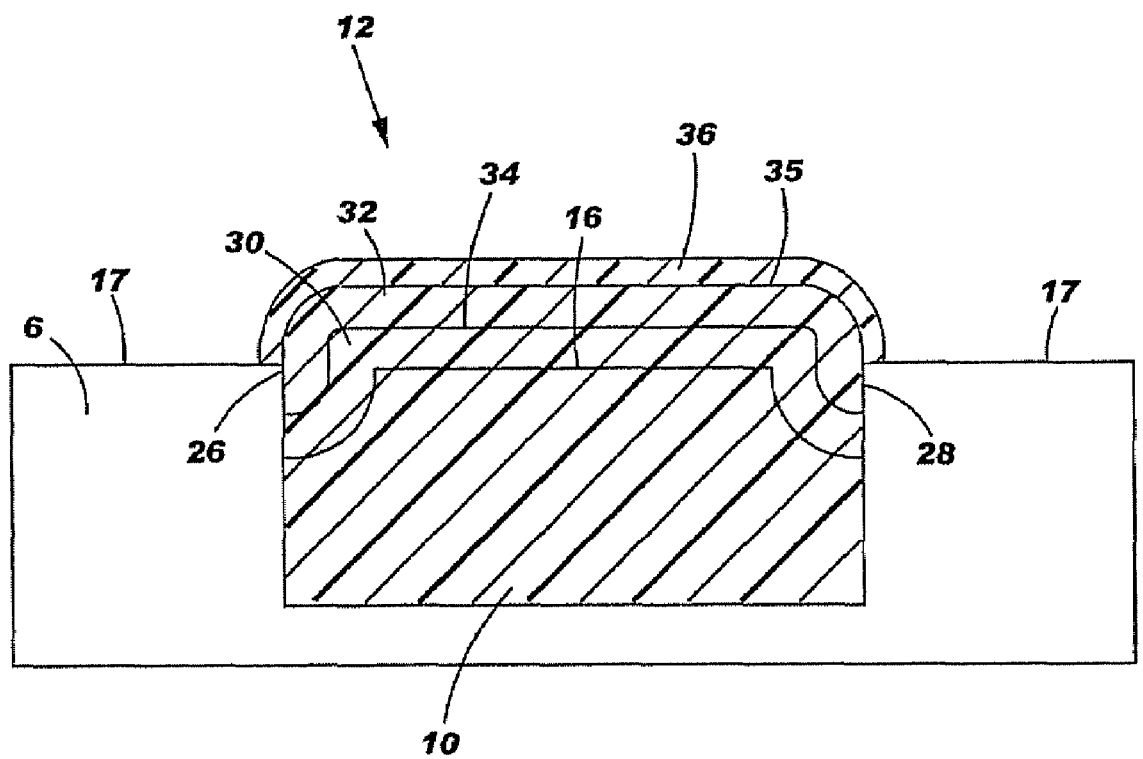

FIG. 1G illustrates an alternative to FIG. 1F showing the shallow trench isolation 12 comprising an additional silicon dioxide layer 36 selectively grown over a surface 35 of the silicon dioxide layer 32 Additionally, the silicon dioxide layer 36 is selectively grown to extend laterally over and parallel to portion of the surface 17 of the silicon substrate 16. The silicon dioxide layer 36 extending laterally over and parallel to a portion of the surface 17 of the silicon substrate 16 prevents any substance (e.g., chemical cleaning agents) from leaking in to the areas 26 and 28 between the silicon substrate 6 and the shallow trench isolation fill 10 and forming divots in subsequent processing steps.

Figure 1H:
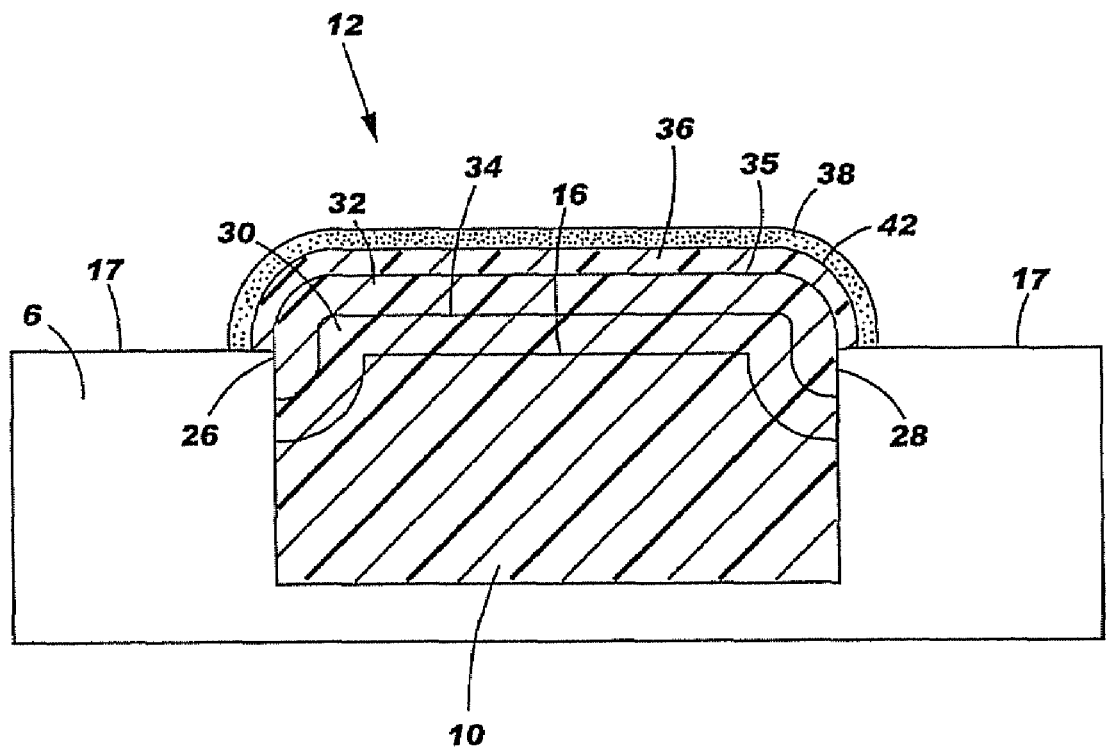

FIG. 1H illustrates an alternative to FIG. 1G showing the shallow trench isolation 12 comprising a silicon oxynitride layer 38 over a surface 42 of the additional silicon dioxide layer 36. The silicon oxynitride layer 38 may formed by nitridization of an oxide layer. The silicon oxynitride layer 38 may provide protection against erosion of the additional silicon dioxide layer 36 subsequent processing steps (e.g., during a hydrofluoric acid cleaning process) and ultimately preventing any substance (e.g., chemical cleaning agents) from leaking in to the areas 26 and 28 between the silicon substrate 6 and the shallow trench isolation fill 10 and forming divots in subsequent processing steps.

Figure 2A:
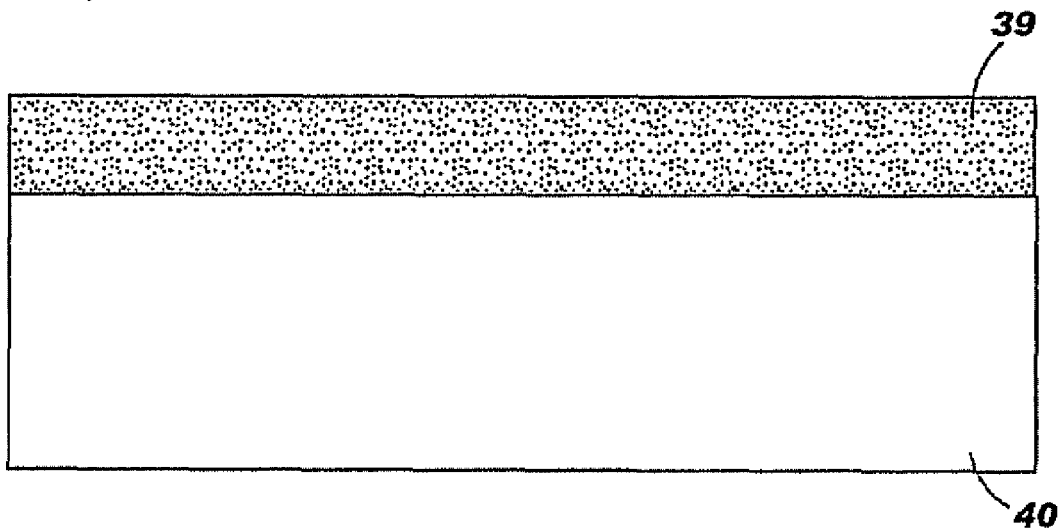
FIGS. 2A-2H illustrates an alternative to FIGS. 1A-1H, in accordance with embodiments of the present invention.
Figure 2B:
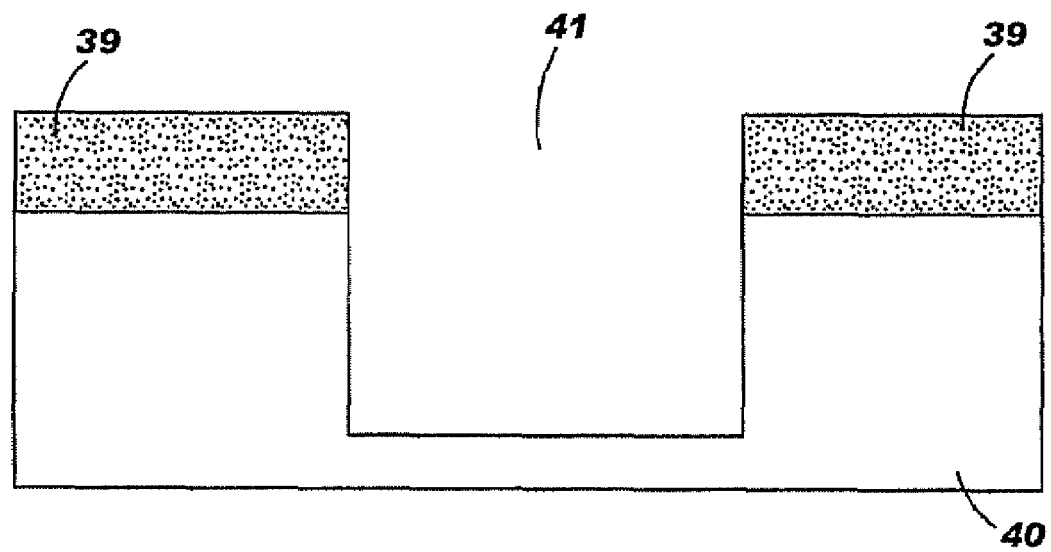
Figure 2C:
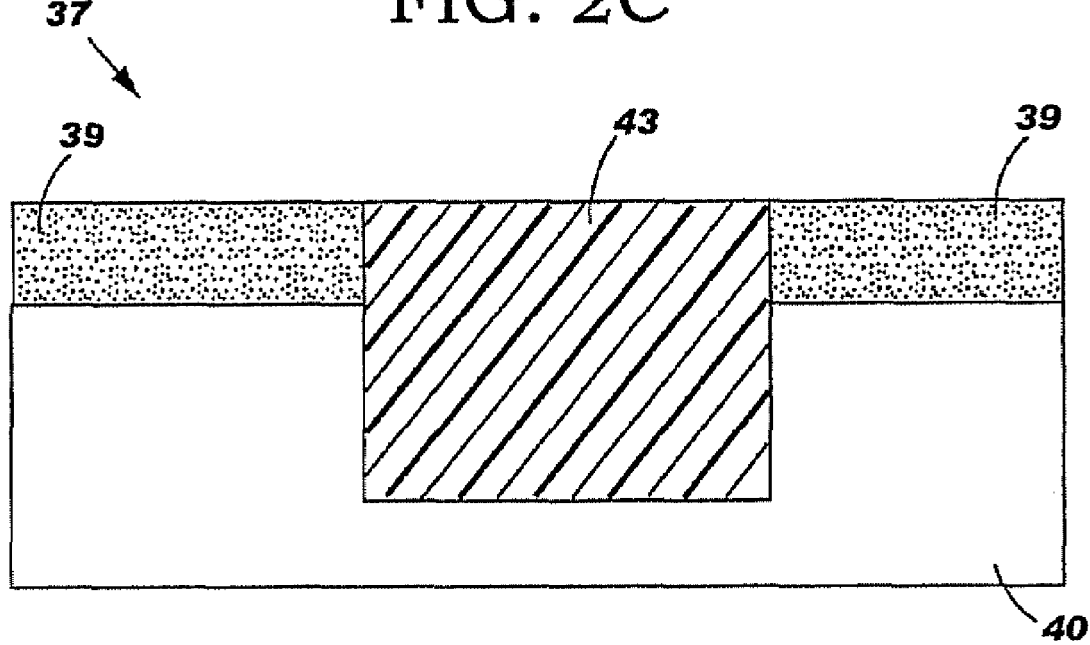
Figure 2D:
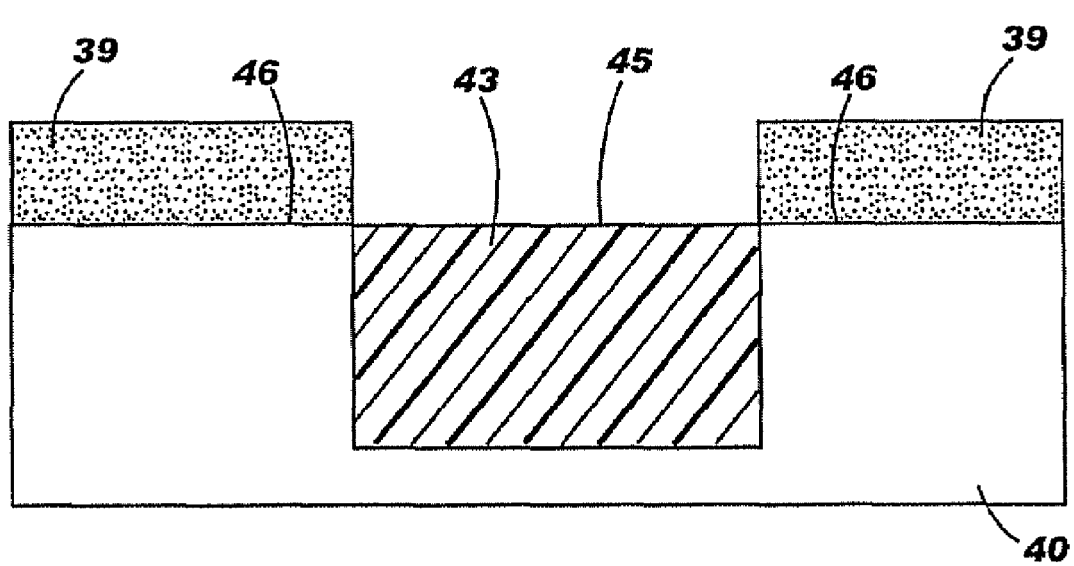
Figure 2E:
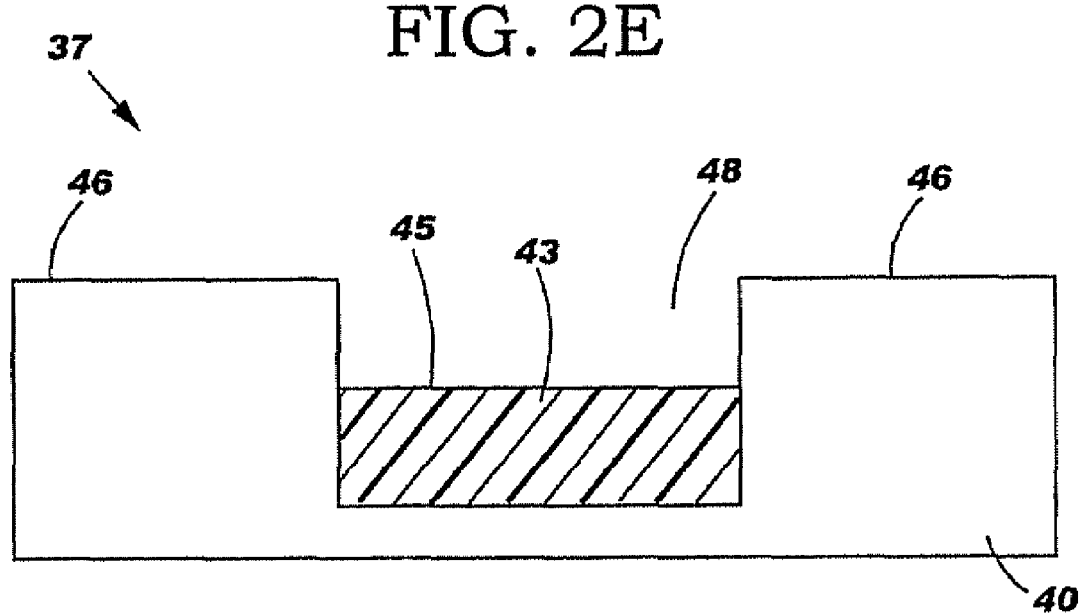
Figure 2F:
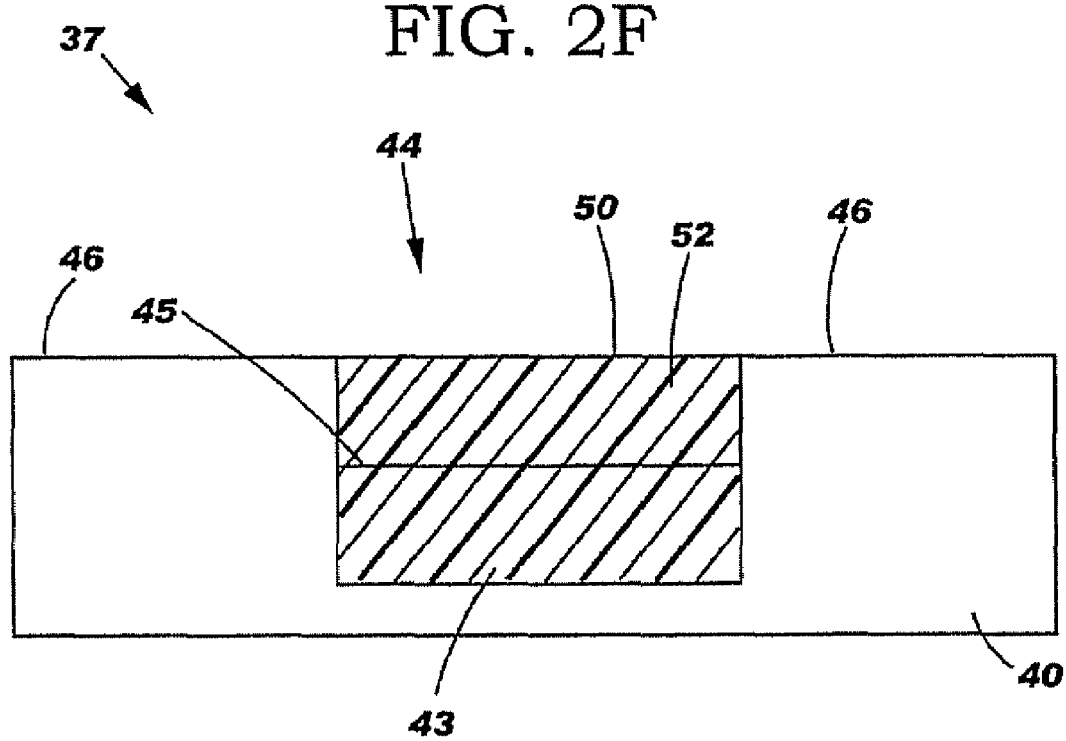

FIGS. 2A-2H illustrates an alternative to FIGS. 1A-1H showing stages in a fabrication of a shallow trench isolation 44 in a semiconductor device 37, in accordance with embodiments of the present invention. The embodiment described with reference to FIGS. 1A-1H provides a method of filling shallow trench oxide divots (e.g., divots 14 and 14b in FIG. 1E) but may not provide a final oxide surface that is co-planar with the silicon surface (see FIG. 1F). In contrast with the embodiment described with reference to FIGS. 1A-1H, the embodiment described with reference to FIGS. 2A-2H provides a method that allows divot formation to be avoided, with an option of providing a shallow trench isolation that is about co-planar with the silicon surface (see FIG. 2F). The semiconductor device 37 illustrated in FIGS. 2A-2H is a cross sectional view. FIGS. 2A-2H illustrates a method to avoid creating the divots 14 from FIGS. 1A-1H. The fabrication is described in greater detail with reference to FIG. 5. The fabrication begins in FIG. 2A with a formation of a silicon nitride layer 39 on a silicon substrate 40. The silicon substrate 40 may be any silicon substrate known to a person of ordinary skill in the art including, inter alia, bulk silicon substrate, silicon on insulator (SOI) substrate, etc. FIG. 2B illustrates the semiconductor device 37 with a shallow trench 41 formed. The shallow trench 41 may be formed by any method known to a person of ordinary skill in the art including, inter alia, a reactive ion etching (RIE) process, chemical etching, etc. FIG. 2C illustrates the semiconductor device 37 comprising a shallow trench isolation fill 43 formed within the shallow trench 41. The shallow trench isolation fill 43 may comprise, inter alia, silicon dioxide, nitride, etc. The shallow trench isolation fill 43 may be formed by any method known to a person of ordinary skill in the art including, inter alia, a tetra ethyl ortho silicate (TEOS) chemical vapor deposition (CVD) process followed by a CMP process, etc. FIG. 2D illustrates the shallow trench isolation 43 fill recessed relative to the silicon nitride layer 39 as to provide a top surface 45 of the shallow trench isolation 43 fill that is coplanar with a top surface 46 of the silicon substrate 40. The shallow trench isolation fill 43 may be recessed to remove a top portion of the shallow trench isolation fill 43 using, inter alia, a reactive ion etching (RIE) or chemical etching process. FIG. 2E illustrates the shallow trench isolation fill 43 such that the top surface 45 is recessed below the top surface 46 of the silicon substrate 40 thereby causing an unwanted recess 48. The unwanted recess 48 may be caused inadvertently by, inter alia, chemical processes (e.g., a hydrofluoric acid dip) used at several points in the fabrication of a semiconductor device in order to clean the surface 46 of the silicon substrate 40 prior to a gate dielectric formation. The recess 48 may be repaired (i.e., filled) by selectively growing silicon dioxide within the recess 48 as shown in FIG. 2F. Selectively growing the silicon dioxide or any other electrically insulative material comprised by the trench 41 may comprise using a liquid phase deposition process.

FIG. 2F illustrates the semiconductor structure 37 with the shallow trench isolation 44 comprising the shallow trench isolation fill 43, the unwanted recess 48 (see FIG. 2E), and the selectively grown silicon dioxide layer 52 within the recess 48. The silicon dioxide layer 52 comprises a surface 50 that is coplanar with the surface 46 of the silicon substrate 40

Figure 2G:
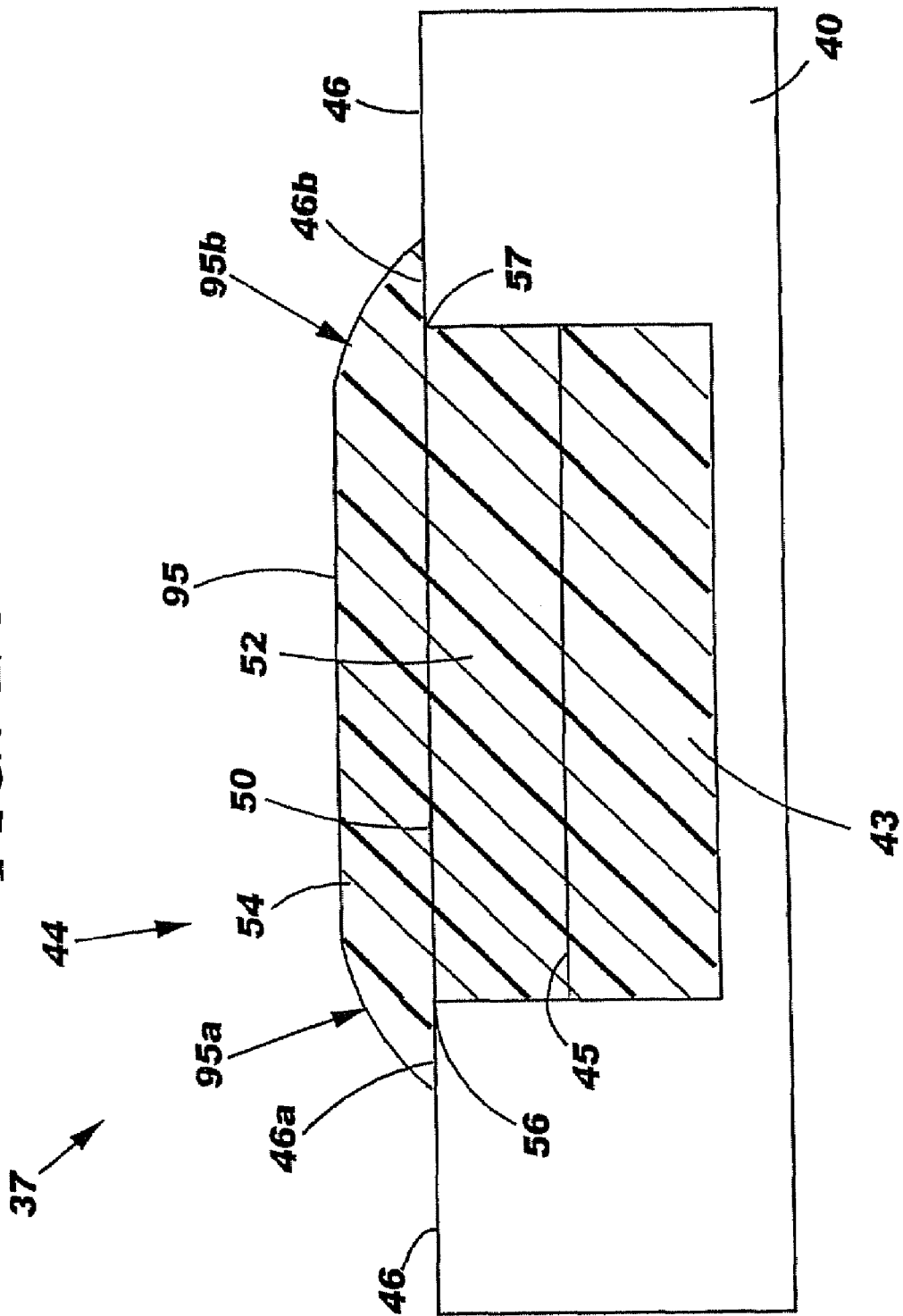

FIG. 2G illustrates an alternative to FIG. 2F showing the shallow trench isolation 44 comprising an additional selectively grown silicon dioxide layer 54. The silicon dioxide layer 54 has been selectively grown over the surface 50. Additionally, the silicon dioxide layer 54 has been selectively grown to extend laterally over and parallel to portions of the surface 46 of the silicon substrate 40. A first portion of the silicon dioxide layer 54 that extends laterally over and parallel to a portion 46a of the surface 46 comprises a convex surface 95a. A second portion of the silicon dioxide layer 54 that extends laterally over and parallel to a portion 46b the surface 46 comprises a convex surface 95b. The silicon dioxide layer 54 extending laterally over and parallel to a portion of the surface 46 of the silicon substrate 40 prevents any substance (e.g., chemical cleaning agents) from leaking in to the areas 56 and 57 between the silicon substrate 40 and the shallow trench isolation fill 43 and 52 and forming recesses or divots in subsequent processing steps.

Figure 2H:
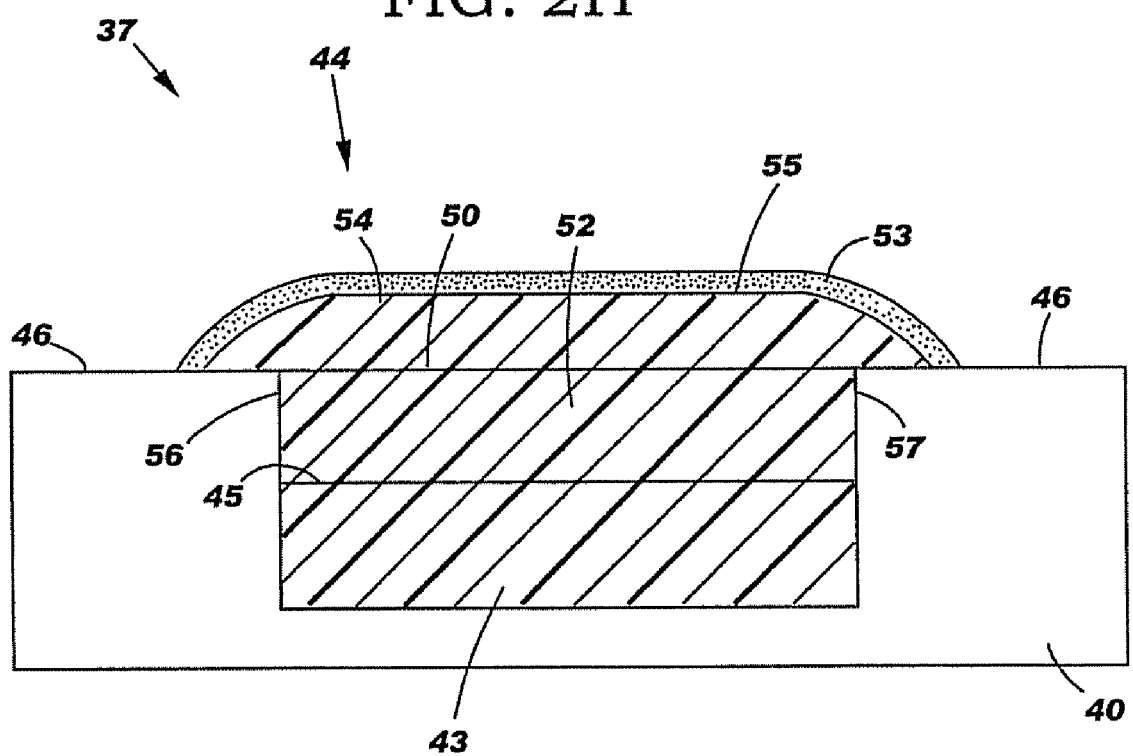

FIG. 2H illustrates an alternative to FIG. 2G showing the shallow trench isolation 44 comprising a silicon oxynitride layer 53 over a surface 55 of the silicon dioxide layer 54. The silicon oxynitride layer 53 may be formed by nitridization of an oxide layer. The silicon oxynitride layer 53 may provide protection against erosion of the silicon dioxide layer 54 in subsequent processing steps (e.g., during a buffered hydrofluoric acid cleaning process) and ultimately preventing any substance (e.g., chemical cleaning agents) from leaking in to the areas 56 and 57 between the silicon substrate 46 and the shallow trench isolation fill 43 and 52 and forming divots in subsequent processing steps.

Figure 3A:
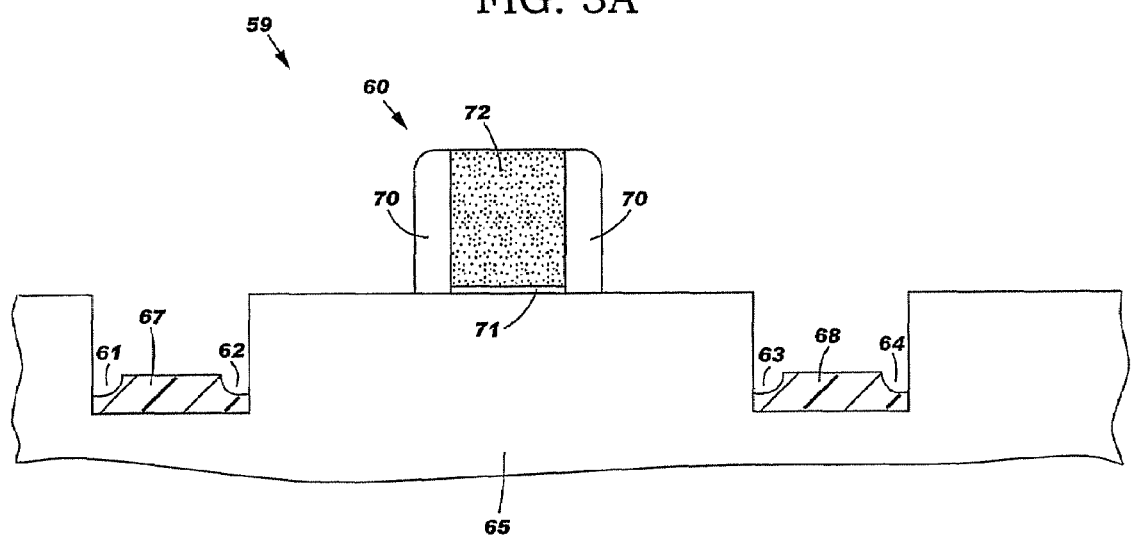
FIGS. 3A-3B illustrate an application of shallow trench isolation, in accordance with embodiments of the present invention.
Figure 3B:
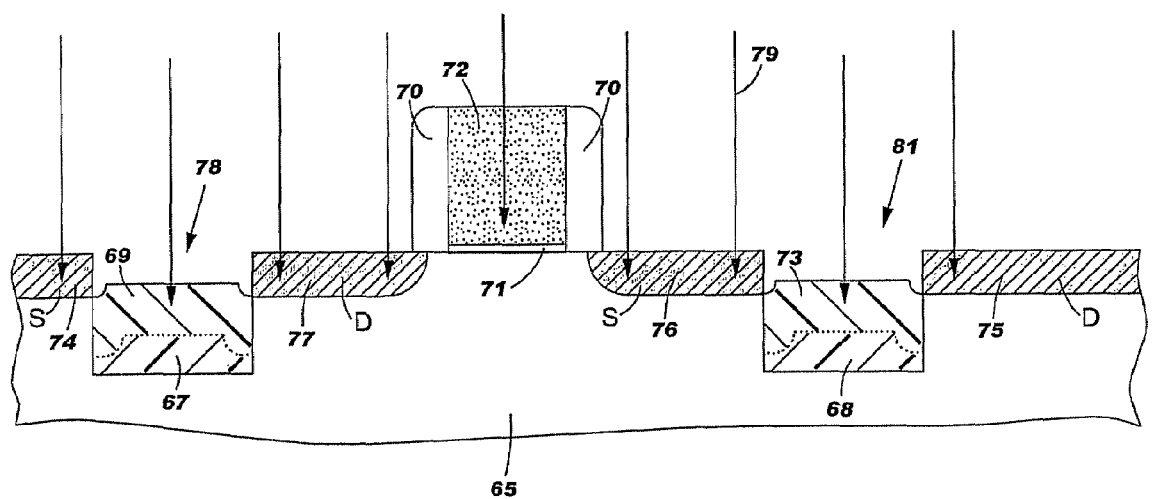

FIGS. 3A-3B illustrate an application of a shallow trench isolation 67 and a shallow trench isolation 68 in a CMOS semiconductor device 59, in accordance with embodiments of the present invention. The CMOS semiconductor device 59 may be a field effect transistor (FET) device. In a process sequence for a fabrication of the CMOS semiconductor device 59, a selective oxide growth of silicon dioxide may be performed at multiple points of the fabrication process. For example, a surface of the selectively grown silicon dioxide layer may be grown such that it is planar a surface of a silicon substrate 65 prior to formation of gate dielectric and gate conductor films and patterning. After the gate conductor is formed, subsequent clean steps can cause an additional unwanted recess of the silicon dioxide layers. If the silicon dioxide becomes too thin, then source/drain implants (see source/drain implants 79 in FIG. 3B) may pass through the silicon dioxide comprising the unwanted and cause an electrical short between adjacent devices. In this case, it may be desirable to increase the thickness of the silicon dioxide layer, by means of selective oxide growth, such that the source/drain implants are sufficiently masked. The semiconductor device 59 illustrated in FIGS. 3A-3B is a cross sectional view. The fabrication is described in more detail with reference to FIG. 6. The fabrication begins in FIG. 3A with a silicon substrate containing a typical CMOS semiconductor device (e.g., CMOS semiconductor device 59) processed up to a gate conductor module 60. FIG. 3A illustrates the shallow trench isolation fill 67, the shallow trench isolation fill 68, a gate dielectric 71, a gate conductor 72, and sidewall spacers 70. The shallow trench fill 67 and 68 may be formed by any method known to a person of ordinary skill in the art including, inter alia, a reactive ion etching process (RIE), a chemical mechanical polish process, etc. The shallow trench isolation fill 67 and 68 may comprise, inter alia, silicon dioxide, silicon oxynitride, spun-on-glass, etc. The shallow trench isolation fill 67 and 68 may be formed by any method known to a person of ordinary skill in the art, including, inter alia, a tetra-ethyl orthosilicate (TEOS) chemical vapor deposition (CVD) process followed by a CMP process, etc. The gate dielectric 71 and gate conductor 72 may be formed by conventional means known to an ordinary person skilled in the art. The gate dielectric 71 may comprise silicon dioxide, silicon oxynitride, hafnium silicate or similar material. The gate conductor 72 may comprise doped polysilicon, tungsten, or similar material as known in the art. At this point in the process, the source 76 and drain 77 will be formed. As seen in FIG. 3A, the shallow trench isolation fill 67 and 68 have been recessed and divots 61, 62, 63, and 64 are present at edges of the shallow trench isolation fill 67 and 68, due to unwanted etching of shallow trench isolation fill oxide during various wet etch clean processes, such as source/drain clean, oxide hard mask removal from gate conductor, nitride or oxide spacer etching, etc. The recessing of the shallow trench isolation fill 67 and 68 may allow the source/drain implants 79 to extend through the shallow trench isolation fill 67 and 68, and allow adjacent semiconductor devices (e.g., source 74 and drain 75) to fail by an electrical shorting mechanism. Accordingly, additional layers 69 and 73 of silicon dioxide are selectively grown to increase a thickness of the shallow trench isolation fill 67 and 68 and create shallow trench isolation 78 and 81 (FIG. 3B). This can be achieved by means of the selective liquid-phase oxide deposition process as described with reference to FIGS. 1A-1H and shown in FIG. 3B.

FIG. 3B illustrates the shallow trench isolation fill 67 and 68 replenished (i.e., made sufficiently thick) by selectively growing additional layers 69 and 73 of silicon dioxide and creating shallow trench isolation 78 and 81. Selectively growing the silicon dioxide or any other electrically insulative material may comprise using a liquid phase deposition process. Embodiments described with reference to FIGS. 1F-1H are also applicable to the embodiments described with reference to FIGS. 3A-3B.

FIG. 4 is a flowchart illustrating a semiconductor device fabrication method 88 including a formation of a shallow trench isolation in the semiconductor device 2 of FIGS. 1A-1H, in accordance with embodiments of the present invention. In step 90, a silicon nitride layer is formed on a silicon substrate. In step 92, the silicon nitride layer is patterned using a photolithography process. The patterned silicon nitride layer is used to define a shallow trench and the shallow trench is etched into the silicon substrate. In step 94, the shallow trench is filled with silicon dioxide thereby forming a shallow trench isolation fill within the shallow trench. The shallow trench isolation fill may be formed by any method known to a person of ordinary skill in the art including, inter alia, a tetra ethyl ortho silicate (TEOS) chemical vapor deposition (CVD) process, etc. In step 96, a planar surface is created on the shallow trench isolation fill by a chemical/mechanical polishing (CMP). The silicon nitride layer is used as a polish stop to protect the silicon substrate. In step 98, silicon nitride layer 4 is removed from the silicon substrate using a hot phosphoric acid. In step 100, semiconductor device processing is continued. The semiconductor device processing may include, inter alia, implanting ions of boron, phosphorous, and arsenic to create a conductive layer, silicon substrate 6 surface cleans, gate dielectric formation, etc. During step 100, divots (i.e., unwanted recesses) are formed in the shallow trench isolation fill. In step 102, the divots are repaired (i.e., filled) by selectively a growing layer (s) of silicon dioxide within the divots and over the shallow trench isolation fill comprising the divots. Additionally, an additional layer(s) of silicon dioxide may be selectively grown to extend laterally over and parallel to a portion of a surface of the silicon substrate to prevent any substance (e.g., chemical cleaning agents) from attacking the shallow trench isolation fill and forming divots in subsequent processing steps. Selectively growing the silicon dioxide may comprise using a liquid phase deposition process. Additionally a silicon oxynitride layer may be formed over a surface of the additional silicon dioxide layer(s). The silicon oxynitride layer may provide protection against erosion of the additional silicon dioxide layer(s) in subsequent processing steps (e.g., during a buffered hydrofluoric acid cleaning process).

Figure 5:
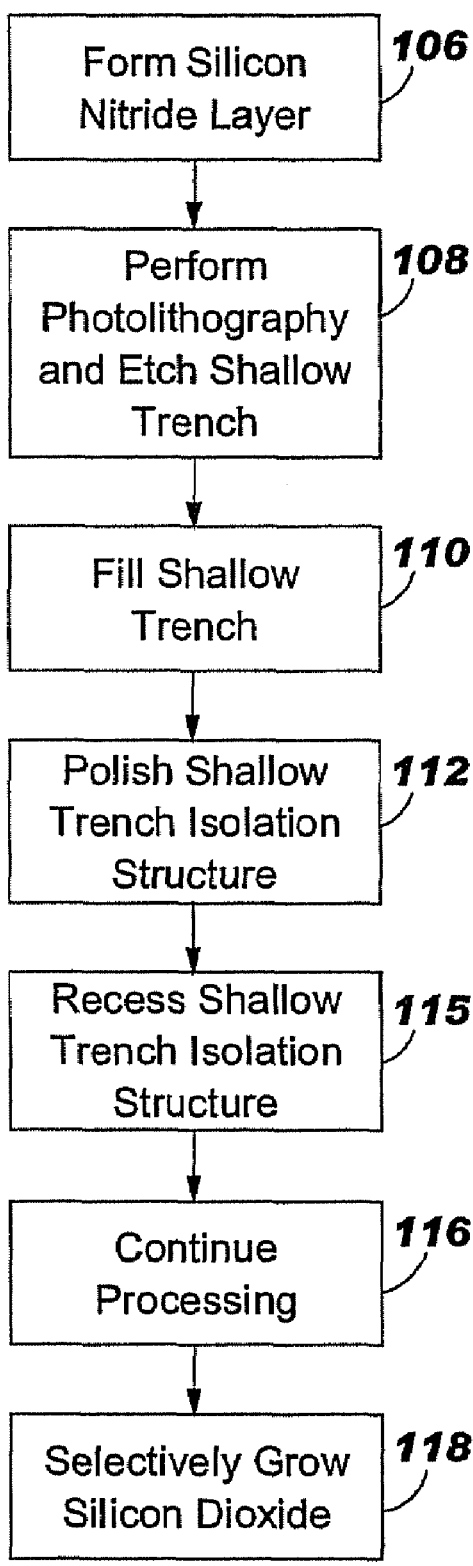
FIG. 5 is a flowchart illustrating a semiconductor device fabrication method of FIGS. 2A-2H, in accordance with embodiments of the present invention.

FIG. 5 is a flowchart illustrating a semiconductor device fabrication method 104 including a formation of a shallow trench isolation in the semiconductor device of FIGS. 2A-2H, in accordance with embodiments of the present invention. In step 106, a silicon nitride layer is formed on a silicon substrate. In step 92, the silicon nitride layer is patterned using a photolithography process. The patterned silicon nitride layer is used to define a shallow trench and the shallow trench is etched into the silicon substrate. In step 110, the shallow trench is filled with silicon dioxide thereby forming a shallow trench isolation fill within the shallow trench 41. The shallow trench isolation fill may be formed by any method known to a person of ordinary skill in the art including, inter alia, a tetra ethyl ortho silicate (TEOS) chemical vapor deposition (CVD) process, etc. In step 112, a planar surface is created on the shallow trench isolation fill by a CMP process. The silicon nitride layer is used as a polish stop to protect the silicon substrate 40. In step 115, the shallow trench isolation fill is recessed relative to the silicon nitride layer as to provide a top surface of the shallow trench isolation fill that is coplanar with a top surface of the silicon substrate. The shallow trench isolation fill may be recessed using, inter alia, a reactive ion etching (RIE) or chemical etching process. In step 116 semiconductor device processing is continued. Due to hydrofluoric acid chemical cleaning agents, a top surface of the shallow trench isolation fill becomes recessed below the top surface of the silicon substrate thereby causing an unwanted recess. In step 118, the recess is repaired (i.e., filled) by selectively growing silicon dioxide within the recess. Selectively growing the silicon dioxide may comprise using a liquid phase deposition process. Additionally, an additional layer(s) of silicon dioxide may be selectively grown to extend laterally over and parallel to a portion of a surface of the silicon substrate to prevent any substance (e.g., hydrofluoric acid) from attacking the shallow trench isolation fill and creating unwanted recesses and/or divots in subsequent processing steps. Additionally a silicon oxynitride layer may be formed over a surface the additional silicon dioxide layer(s). The silicon oxynitride layer may provide protection against erosion of the additional silicon dioxide layer(s) in subsequent processing steps (e.g., during a buffered hydrofluoric acid cleaning process).

Figure 6:
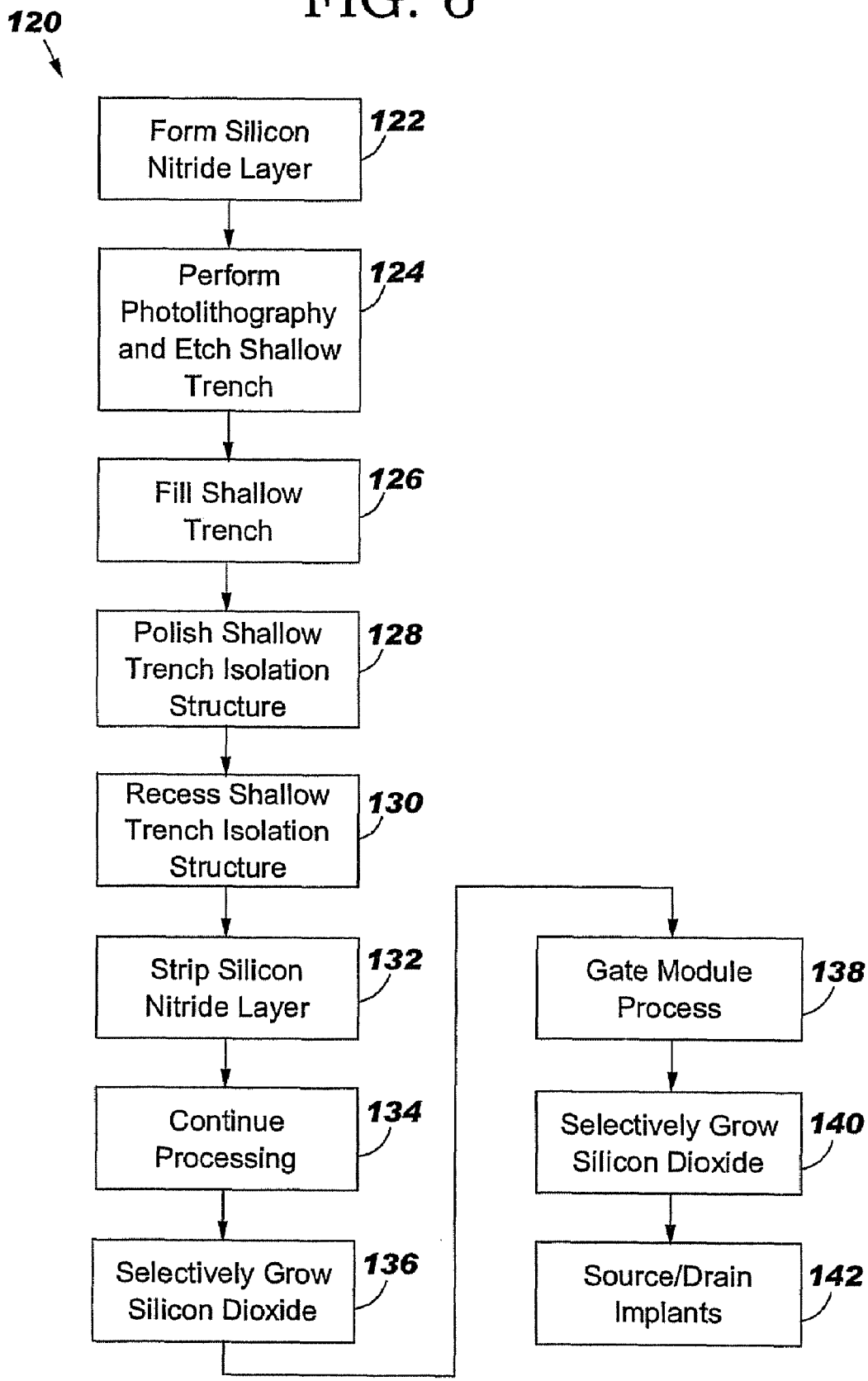
FIG. 6 is a flowchart illustrating a semiconductor device fabrication method of FIGS. 3A-3B, in accordance with embodiments of the present invention.

FIG. 6 is a flowchart illustrating a semiconductor device fabrication method 120 including a formation of a shallow trench isolation in the semiconductor device of FIGS. 3A-3B, in accordance with embodiments of the present invention. In step 122, a silicon nitride layer is formed on a silicon substrate. In step 124, the silicon nitride layer is patterned using a photolithography process. The patterned silicon nitride layer is used to define a shallow trench and the shallow trench is etched into the silicon substrate. In step 126, the shallow trench is filled with silicon dioxide thereby forming a shallow trench isolation fill within the shallow trench. The shallow trench isolation fill may be formed by any method known to a person of ordinary skill in the art including, inter alia, a tetra ethyl ortho silicate (TEOS) chemical vapor deposition (CVD) process, etc. In step 128, shallow trench isolation fill is chemically or mechanically polished to create a planar surface of the shallow trench isolation fill. The silicon nitride layer is used as a polish stop to protect the silicon substrate. In step 130, the shallow trench isolation fill is recessed relative to the silicon nitride layer as to provide a top surface of the shallow trench isolation fill that is coplanar with a top surface of the silicon substrate. The shallow trench isolation fill may be recessed using, inter alia, a reactive ion etching (RIE) or chemical etching process. In step 132, silicon nitride layer is removed from the silicon substrate using a hot phosphoric acid. In step 134 semiconductor device processing is continued. In step 136, a layer of silicon dioxide is selectively grown as described with reference to FIGS. 1A-1H and 2A-2H. In step 138, a gate dielectric is formed, and a gate conductor material is deposited and patterned by conventional methods. Sidewall spacers of silicon nitride or oxide are also formed, by conventional methods. Due to hydrofluoric acid cleans, oxide hard mask removal, and spacer etching, a top surface of the layer of silicon dioxide selectively grown in step 136 becomes recessed such that the top surface is recessed below the top surface of the silicon substrate and/or divots are formed. The shallow trench isolation must be sufficiently thick to prevent source and drain implants (i.e., in a subsequent step 142) from passing through the shallow trench isolation and into a region of the silicon substrate underlying the shallow trench isolation. The source and drain implants cause the silicon substrate to become conductive and may short components together that may be located on both sides of the shallow trench isolation. In step 140, the shallow trench isolation is replenished (i.e., be made sufficiently thick) by selectively growing silicon dioxide within the recess or portion of the recess. Selectively growing the silicon dioxide may comprise using a liquid phase deposition process. Additionally, an additional layer(s) of silicon dioxide may be selectively grown to extend laterally over and parallel to a portion of a surface of the silicon substrate to prevent any substance (e.g., chemical cleaning agents) from attacking the shallow trench isolation fill and creating unwanted trenches and/or divots in subsequent processing steps. Additionally a silicon oxynitride layer may be formed over a surface of the additional silicon dioxide layer(s). The silicon oxynitride layer may provide protection against erosion of the additional silicon dioxide layer(s) in subsequent processing steps (e.g., during a buffered hydrofluoric acid cleaning process). In step 142, source/drain implants are formed.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
    a semiconductor substrate, wherein said semiconductor substrate comprises a trench formed within a first portion of a first surface of said semiconductor substrate;
    a first layer of electrically insulative material formed within the trench, wherein the first layer consists of only a single recess;
    a second layer of electrically insulative material within the single recess; and
    a third layer of electrically insulative material over said second layer, wherein said third layer comprises a first portion extending laterally over and parallel to a second portion of said first surface of said semiconductor substrate and a second portion extending laterally over and parallel to a third portion of said first surface of said semiconductor substrate, wherein a bottom surface of said third layer is in contact with only said second layer and said first surface of said semiconductor substrate, wherein said first portion of said third layer comprises a first convex surface, and wherein said second portion of said third layer comprises a second convex surface.

2. The semiconductor structure of claim 1, wherein each of said first layer and said second layer comprises silicon dioxide.

3. The semiconductor structure of claim 1, wherein said second layer comprises a surface that is coplanar with said first surface of the semiconductor substrate.

4. The semiconductor structure of claim 1, wherein said third layer comprises silicon dioxide.

5. The semiconductor structure of claim 1, further comprising:
    a silicon oxynitride layer formed on said third layer of electrically insulative material.

6. The semiconductor structure of claim 5, wherein said silicon oxynitride layer is in direct contact with said third layer and said first surface of said semiconductor substrate.

7. The semiconductor structure of claim 5, wherein said silicon oxynitride layer comprises a first section and a second section, wherein said first section comprises a first concave surface and a third convex surface, and wherein said second section comprises a second concave surface and a fourth convex surface.

8. The semiconductor structure of claim 1, wherein said first layer and said second layer in combination form a shallow trench isolation.

9. The semiconductor structure of claim 1, wherein the semiconductor structure is a complementary metal oxide semiconductor (CMOS) semiconductor structure.

10. The semiconductor structure of claim 1, wherein an entire bottom surface of said second layer of electrically insulative material is in contact with an entire top surface of said first layer of electrically insulative material.

11. A method for forming semiconductor structure, comprising:
    providing a semiconductor substrate;
    forming a trench within a first portion of a first surface of said semiconductor substrate;
    forming a first layer of electrically insulative material within the trench;
    forming a single recess within the first layer;
    forming a second layer of electrically insulative material within the single recess; and
    forming a third layer of electrically insulative material over said second layer, wherein said third layer comprises a first portion extending laterally over and parallel to a second portion of said first surface of said semiconductor substrate and a second portion extending laterally over and parallel to a third portion of said first surface of said semiconductor substrate, wherein a bottom surface of said third layer is in contact with only said second layer and said first surface of said semiconductor substrate, wherein said first portion of said third layer comprises a first convex surface, and wherein said second portion of said third layer comprises a second convex surface.

12. The method of claim 11, wherein each of said first layer and said second layer comprises silicon dioxide.

13. The method of claim 11, wherein said second layer comprises a surface that is coplanar with said first surface of the semiconductor substrate.

14. The method of claim 11, wherein said third layer comprises silicon dioxide.

15. The method of claim 11, further comprising:
    forming a silicon oxynitride layer on said third layer of electrically insulative material.

16. The method of claim 15, wherein said silicon oxynitride layer is in direct contact with said third layer and said first surface of said semiconductor substrate.

17. The method of claim 15, wherein said silicon oxynitride layer comprises a first section and a second section, wherein said first section comprises a first concave surface and a third convex surface, and wherein said second section comprises a second concave surface and a fourth convex surface.

18. The method of claim 11, wherein said first layer and said second layer in combination form a shallow trench isolation.

19. The method of claim 11, wherein the semiconductor structure is a complementary metal oxide semiconductor (CMOS) semiconductor structure.

20. The method of claim 11, wherein an entire bottom surface of said second layer of electrically insulative material is in contact with an entire top surface of said first layer of electrically insulative material.

* * * * *